United States Patent [19]

Vasudev

[11] Patent Number: 5,027,177
[45] Date of Patent: Jun. 25, 1991

[54] FLOATING BASE LATERAL BIPOLAR PHOTOTRANSISTOR WITH FIELD EFFECT GATE VOLTAGE CONTROL

[75] Inventor: Prahalad K. Vasudev, Thousand Oaks, Calif.

[73] Assignee: Hughes Aircraft Company, Los Angeles, Calif.

[21] Appl. No.: 383,469

[22] Filed: Jul. 24, 1989

[51] Int. Cl.$^5$ .................. H01L 27/14; H01L 31/00
[52] U.S. Cl. ........................ 357/30; 357/23.7; 357/34; 357/4
[58] Field of Search .......... 357/30 G, 30 I, 30 P, 357/23.7, 23.8, 23.14, 30 K, 30 H, 4, 34

[56] References Cited

U.S. PATENT DOCUMENTS

| | | | |
|---|---|---|---|
| 4,143,266 | 3/1979 | Borel et al. | 357/30 I |
| 4,598,305 | 7/1986 | Chiang et al. | 357/30 I |
| 4,609,929 | 9/1986 | Jayaraman et al. | 357/23.4 |
| 4,639,761 | 1/1987 | Singer et al. | 357/23.8 |
| 4,731,640 | 3/1988 | Bluzer | 357/30 H |
| 4,740,823 | 4/1988 | Thompson | 357/30 I |
| 4,748,485 | 5/1988 | Vasudev | 357/23.14 |
| 4,766,482 | 8/1988 | Smeltzer et al. | 357/4 |
| 4,823,180 | 4/1989 | Wieder et al. | 357/30 K |
| 4,866,498 | 9/1989 | Myers | 357/30 I |

FOREIGN PATENT DOCUMENTS

| | | | |
|---|---|---|---|
| 0228107 | 7/1987 | European Pat. Off. | 357/23.8 |
| 0043872 | 3/1980 | Japan | 357/23.7 |
| 0130472 | 8/1982 | Japan | 357/23.7 |
| 0126666 | 7/1984 | Japan | 357/23.7 |
| 62-30385 | 2/1987 | Japan | 357/30 I |

OTHER PUBLICATIONS

Colinge, "An SOI . . . MOS device", IEEE, vol. ED-34, No. 4, Apr. 1987.

*Primary Examiner*—Rolf Hille
*Assistant Examiner*—Minhloan Tran
*Attorney, Agent, or Firm*—Paul M. Coble; W. K. Denson-Low

[57] ABSTRACT

A lateral bipolar phototransistor having a floating, photosensitive base region is formed in a silicon layer on an insulator substrate. Insulated gate electrodes are formed above and below the base region and are voltage biased to create a field effect causing majority carriers to accumulate in the base region. The majority carriers accumulate in layers which face the respective gate electrodes and extend between an emitter and collector of the bipolar transistor. A bias voltage applied to the gate electrodes has a polarity opposite to a polarity of the majority carriers in the emitter and collector regions and is sufficiently high to bias field effect transistors constituted by the gate electrodes in combination with the emitter, base and collector of the bipolar phototransistor into cutoff. The accumulation creates a depleted base region with reduced parasitic capacitance and resistance, thereby enabling higher frequency operation and current gain.

5 Claims, 3 Drawing Sheets

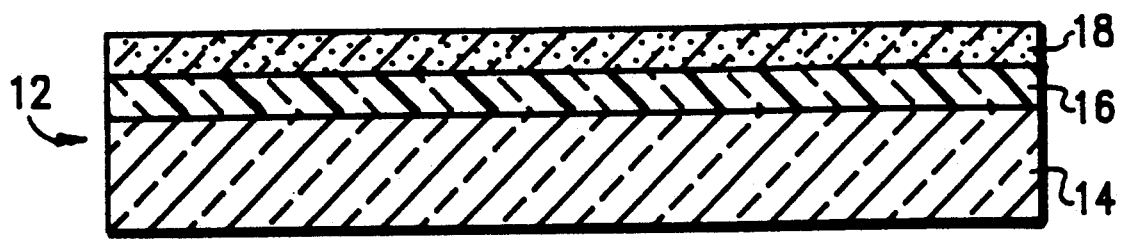
Fig.5.a.
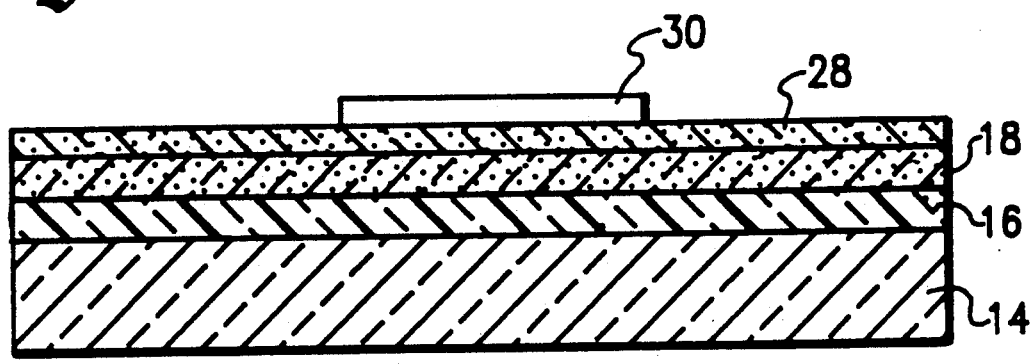
Fig.5.b.
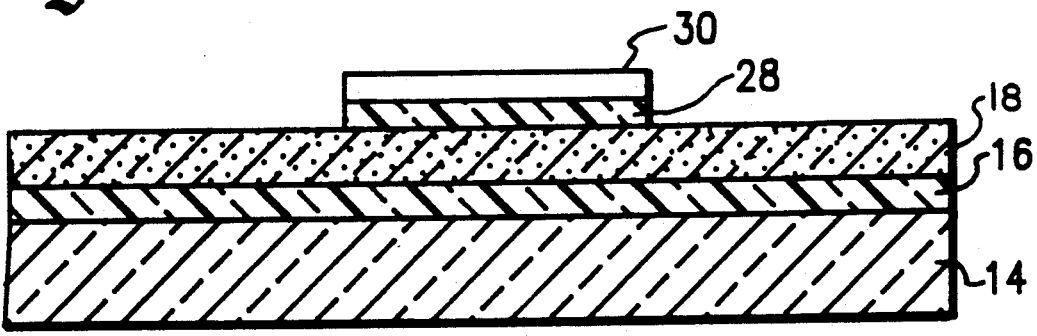
Fig.5.c.
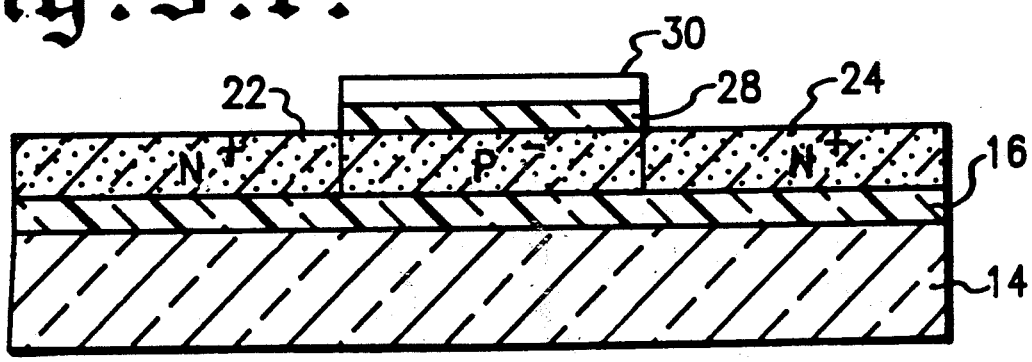
Fig.5.d.

FLOATING BASE LATERAL BIPOLAR PHOTOTRANSISTOR WITH FIELD EFFECT GATE VOLTAGE CONTROL

BACKGROUND OF THE INVENTION

1. Field of the Invention

The present invention generally relates to the art of optoelectronic semiconductor devices, and more particularly to a floating base lateral bipolar phototransistor which incorporates field effect gate voltage control to increase operating frequency and gain.

2. Description of the Related Art

High gain optical detectors or imaging arrays are used in sensors, video, imaging, and thermal/optical mapping in a variety of aerospace, commercial, and other applications. High speed photodetectors with electrically controlled gain and responsivity are used in optical communication systems, local area networks and various optical sensing and imaging applications. Photodetectors which are capable of high speed and high gain operation and which detect optical radiation from the deep ultraviolet (200 nm) to visible (800 nm) spectral regions are especially desirable.

Known optoelectronic semiconductor devices include photodiodes, bipolar phototransistors, and field effect (FET) phototransistors. These devices operate on the principle that irradiation of a semiconductor material with light causes liberation of electron-hole pairs in the material. This causes increased current flow through the devices in a desired manner according to the design criteria.

Photodiodes are limited in that they do not produce amplification. Field effect phototransistors suffer from the drawback of low frequency response in bulk silicon substrates.

Conventional bipolar phototransistors formed in bulk silicon substrates have low frequency response, low common emitter gain ($\beta$), and cannot effectively absorb deep ultraviolet radiation in the region of high gain (away from the Si/SiO$_2$ interface). These limitations are primarily due to the device parasitics (capacitance between base-emitter and base-collector junctions, and base series resistance) and the lack of a base region directly exposed to the optical radiation.

The parasitic capacitances in bipolar devices can be reduced by forming the active regions in a silicon layer on an insulator substrate. A number of processes are available for forming silicon-on-insulator (SOI) substrates, including Separation by Implanted Oxygen (SIMOX), wafer bonding, and Zone-Melting-Recrystallization (ZMR). Crystallinity of this material can be improved by Double Solid Epitaxy (DSPE) or a new solid state epitaxy and regrowth (SPEAR) process disclosed by the present inventor in U.S. Pat. No. 4,509,990.

Bipolar devices in general and Metal-Oxide-Semiconductor (MOS) devices are normally considered to be separate and distinct, with each having its own advantages and disadvantages.

A major advantage of bipolar devices formed in silicon or GaAs is their ability to operate at higher gain than MOS devices. However, conventional bulk bipolar devices typically have fixed low gain, which is a disadvantage in many circuits since additional components may be needed to increase the overall gain of the circuit. In addition, bipolar devices require a more complex fabrication process than MOS devices, and occupy considerably more space than MOS devices on an integrated circuit chip.

Although MOS devices are limited in current handling capacity relative to bipolar devices, they have the major advantages of simplicity of fabrication and high packing density. Although bipolar and MOS devices have been formed on single integrated circuit chips to produce "BIMOS" circuits, such known devices have been difficult and expensive to manufacture reliably due to the necessity of using both bipolar and MOS masking and doping steps during the fabrication process. Optoelectronic semiconductor devices which combine the advantages of bipolar and MOS technologies while avoiding the drawbacks thereof have been unknown in the art.

SUMMARY OF THE INVENTION

In view of the limitations associated with the related art, it is a purpose of the present invention to provide a floating base, lateral bipolar phototransistor with field effect gate voltage control having high frequency response, high current gain, and a photoresponsive range extending from the far ultraviolet to visible light regions. The lateral geometry allows direct exposure of the base region to the optical radiation.

It is another purpose of the present invention to combine the advantages of bipolar and MOS technologies in a single device which enables the fabrication of a dense, two dimensional array of phototransistors in a single integrated circuit chip using a simple Complementary-Metal-Oxide-Semiconductor (CMOS) process. The invention further enables integration of a bipolar phototransistor having high speed and gain on a single chip with low power CMOS logic circuitry for processing the output signal of the phototransistor.

The above goals are achieved by the present invention in a lateral bipolar phototransistor having a floating, photosensitive base region formed in a silicon layer on an insulator substrate. Insulated gate electrodes are formed above and below the base region and are voltage biased to create a field effect causing majority carriers to accumulate in the base region. The majority carriers accumulate in layers which face the respective gate electrodes and extend between an emitter and collector of the bipolar transistor. Field effect transistors are formed by the gate electrodes in combination with the emitter, base and collector of the bipolar phototransistor. A bias voltage applied to the gate electrodes has a polarity opposite to the polarity of the majority carriers and is sufficiently high to bias the FETs into cutoff. The device is fabricated on a silicon-on-insulator substrate formed by a SIMOX, ZMR, or other appropriate process.

The silicon insulator layer directly beneath the bipolar transistor active regions provides a substantial reduction in parasitic capacitance, thereby increasing frequency response and gain compared with a bulk silicon substrate. The device can be fabricated using conventional CMOS techniques and integrated with MOS devices on a monolithic integrated circuit chip.

The accumulation of majority carriers by the applied gate bias voltage creates a depleted base region with reduced parasitic capacitance and resistance, thereby enabling yet higher frequency operation and high current gain.

These and other features and advantages of the present invention will be apparent to those skilled in the art

DESCRIPTION OF THE DRAWINGS

FIGS. 5a to 5d are diagrams illustrating a fabrication process for the device.

DETAILED DESCRIPTION OF THE INVENTION

Figure 1:
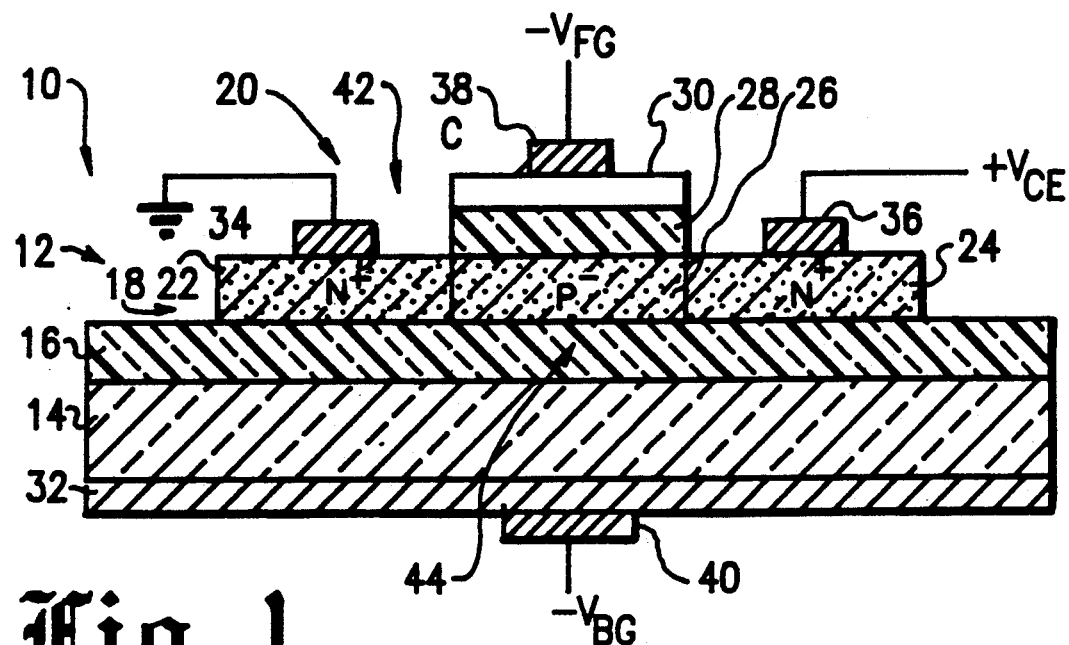
FIG. 1 is a schematic sectional view of a phototransistor device embodying the present invention.
Figure 2:
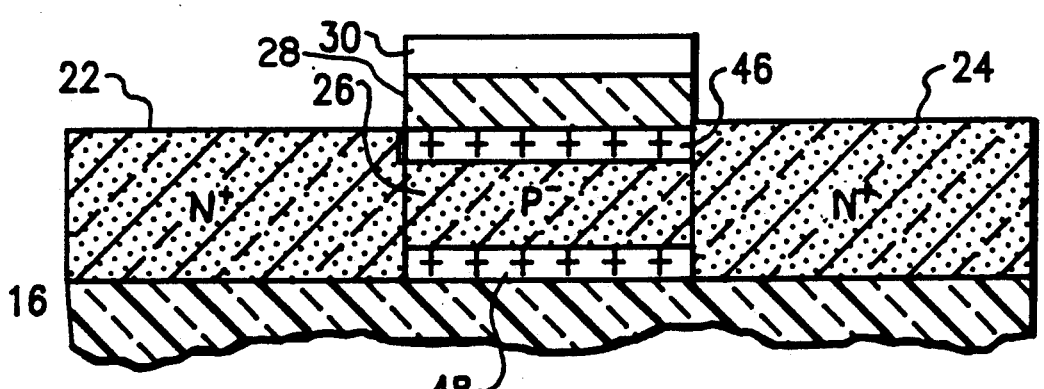
FIG. 2 is a fragmentary sectional view of the device illustrating formation of accumulation layers in a base region thereof.
Figure 3:
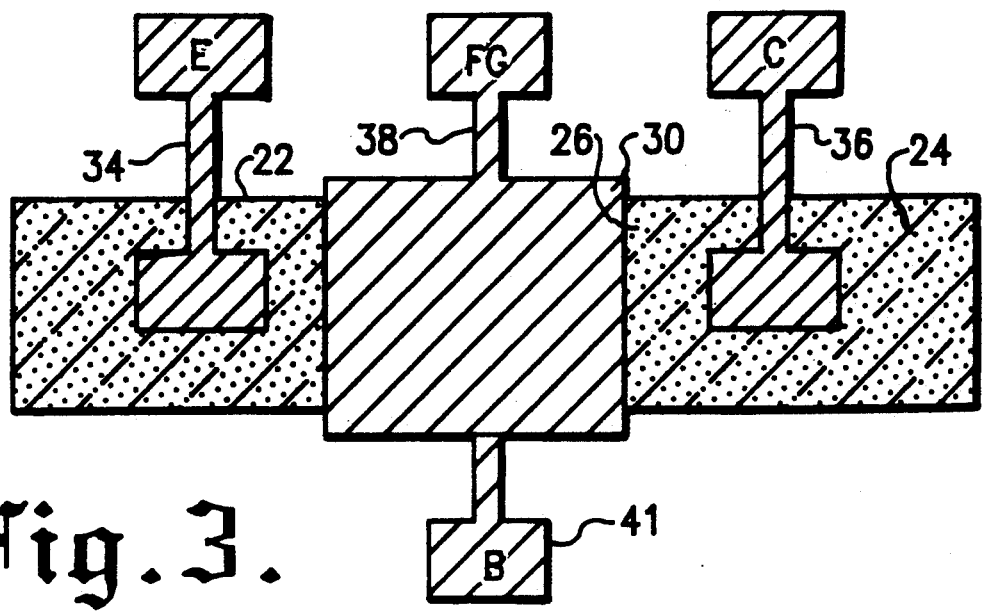
FIG. 3 is a schematic top view of the device.

With reference being made to FIGS. 1 to 3 of the drawings, a phototransistor device 10 embodying the present invention includes a substrate 12 formed by, for example, the SIMOX process. The substrate 12 includes a bulk silicon layer 14 on which is formed an insulator layer 16 of silicon dioxide. The following discussion is relevant to an NPN transistor. However, a PNP device is also feasible. A device quality silicon semiconductive layer 18 which is initially lightly doped with a P type impurity is formed on the insulator layer 16.

As will be described in detail below, a lateral bipolar phototransistor 20 is formed in the silicon layer 18, having a heavily doped N type emitter region 22 and a heavily doped N type collector region 24. A floating base region 26 containing the initial P type impurity concentration is formed between the emitter and collector regions 22 and 24. Although not illustrated, means are provided for exposing at least the junction of the collector and base regions 24 and 26 to a source of light which the phototransistor device is intended to detect.

In accordance with an important feature of the invention, a transparent insulator layer 28 is formed over the base region 26, and a transparent front gate electrode 30 made of a conductive material is formed over the insulator layer 28. The base region 26, insulator layer 28, and front gate electrode 30 are coextensive and vertically aligned with each other.

The device 10 further includes a back gate electrode 32 in the form of a conductive layer on the back surface of the substrate 12, opposite to the silicon layer 18. Conductive contact pads 34, 36, 38 and 40 provide means for external circuit connections to the emitter region 22, collector region 24, front gate electrode 30, and back gate electrode 32 respectively. Further designated as 41 in FIG. 3 is an optional contact pad 41 for connection of the base region 26 to the external circuit.

The front gate electrode 30 and back gate electrode 32 in combination with the base 26 regions of the bipolar transistor 20 constitute gate regions of first and second field effect transistors 42 and 44 respectively. The emitter region 22 and collector region 24 of the bipolar phototransistor 20 function as the respective source and drain of each of the FETs 42 and 44. The base region 26 of the bipolar phototransistor 20 constitutes the channel of the FETs 42 and 44.

The FETs 42 and 44 superficially resemble conventional N-channel, enhancement mode FETs. If such were the case, a positive bias voltage would be applied to each respective gate electrode 30 and 32 to attract or accumulate minority carriers, in this case electrons, to the upper and lower surfaces of the channel (base) region 26 to form N-type channels enabling electron flow between the source (emitter) 22 and drain (collector) 24. The bias voltages would also have the effect of repelling majority carriers, in this case holes, away from the upper and lower surfaces of the base region 26.

The present invention achieves the purposes described above by applying bias voltages which are opposite in polarity to those in a conventional FET to the gate electrodes 30 and 32. As viewed in FIG. 2, negative bias voltages $-V_{FG}$ and $-V_{BG}$ are applied to the gate electrodes 30 and 32, causing majority carriers (holes) to accumulate in layers 46 and 48 at the surfaces of the channel (base) region 26 facing the gate electrodes 30 and 32 respectively. The accumulation layers 46 and 48 extend laterally between the source (emitter) region 22 and the drain (collector) region 24.

In operation, the base region 26 of the bipolar phototransistor 20, which is also the channel region of the field effect transistors 42 and 44, is maintained in a floating condition without external electrical connection. A voltage $+V_{CE}$ is applied to the collector region 24, which is positive relative to the ground potential illustrated as being applied to the emitter region 22. The negative bias voltages applied to the gate electrodes 30 and 32 are sufficiently high to deplete the channel (base) region 26 through accumulation of majority carriers in the layers 46 and 48 and bias the FETs 42 and 44 into cutoff in the absence of incident light on the device 10.

Photons of light incident on the device 10 in the area of the junction between the base region 26 and collector region 24 cause the liberation of electron-hole pairs. The liberated electrons are swept into the collector region 24. The corresponding holes are retained in the base region 26 and increase the net positive charge therein, which in turn increases the forward bias at the junction of the emitter region 22 and base region 26. The increased forward bias causes increased flow of electrons from the emitter region 22 through the base (channel) region 26 and the collector region 24 to an external circuit (not shown). Each liberated electron-hole pair results in the flow of electrons through the device 10 in a number equal to the common emitter gain factor ($\beta$) of the bipolar phototransistor 20. The liberated holes eventually establish an equilibrium condition through recombination with electrons. The gain factor $\beta$, expressed in quantum terms, is equal to $T_H/T_E$, where $T_H$ is the hole recombination time and $T_E$ is the length of time required for electrons to transit through the base region 26.

Figure 4:
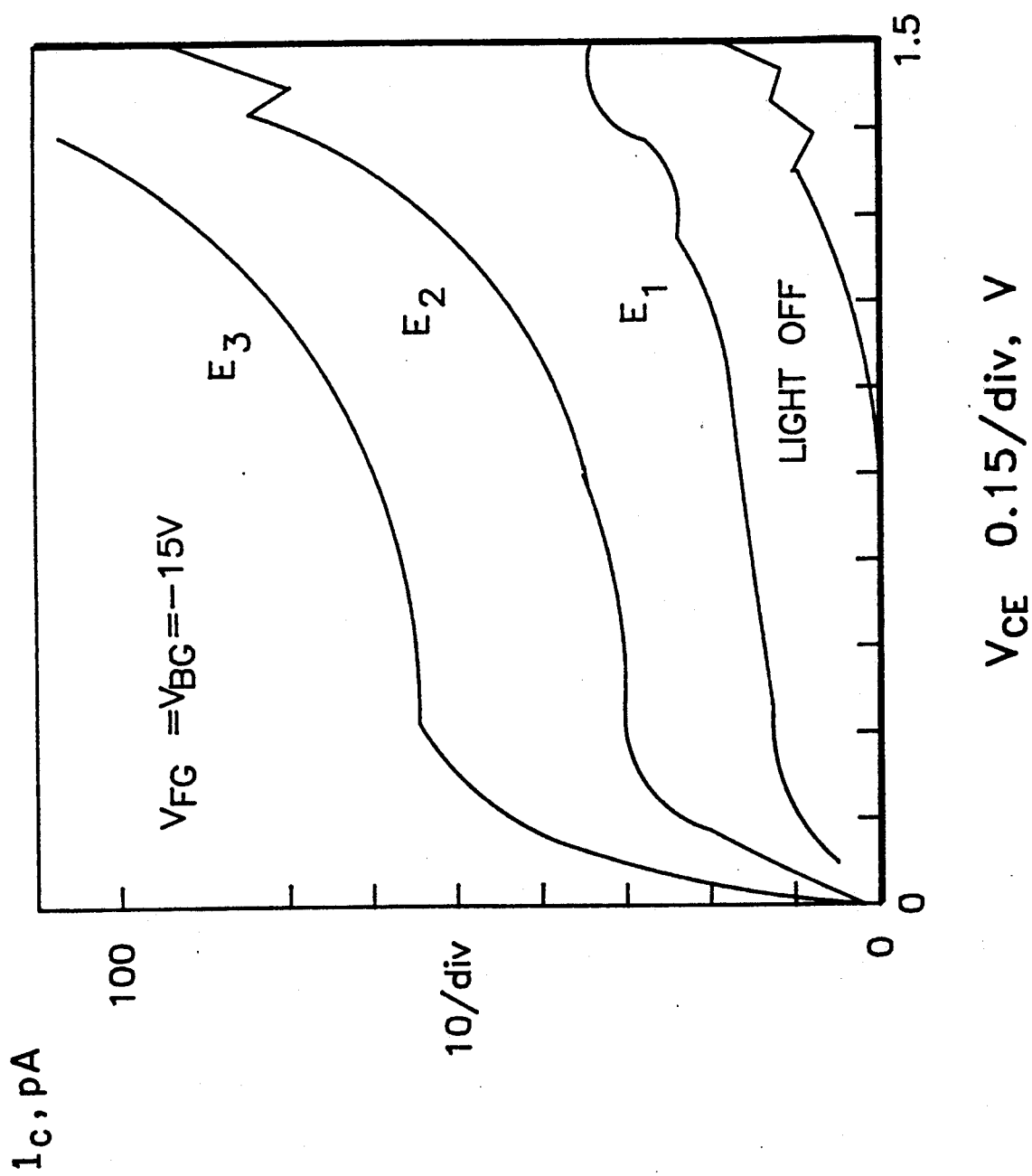
FIG. 4 is a graph illustrating the operation of the present phototransistor device.

The performance of the device 10 with both gate electrodes 30 and 32 biased to $-15V$ (sufficient to completely accumulate the base region 26) is illustrated in FIG. 4 for zero light and increasing intensities $E_1$ to $E_3$ of incident light. The collector current $I_C$ is plotted as a function of collector-emitter voltage $V_{CE}$. The dark current, with no incident light, is less than 1 fA. The device exhibits bipolar phototransistor behavior with gain increasing as a function of incident light.

Varying the gate bias voltages from zero to full accumulation potential enables electronic control of the gain and frequency response. Increasing the bias voltages increases the frequency response while decreasing the gain.

The advantages of the present device 10 result from a combination of effects. The accumulation layers 46 and 48 reduce the effective thickness of the base region 26 to the depleted area between the layers 46 and 48. This produces smaller emitter-base and collector-base junctions, which reduce the parasitic capacitance and surface recombination, resulting in higher frequency response. The higher effective P type doping in the accumulation layers 46 and 48 lowers the contact resistance of the base region 26, which further increases the frequency response. Also, the lower effective doping level in the depleted base area enables increased current flow and higher current gain.

A method of fabricating the present phototransistor device is illustrated in FIGS. 5a to 5d. In FIG. 5a, the substrate 12 is provided by means of, for example, the SIMOX technique. Oxygen ions are implanted into a bulk silicon wafer. An oxide cap is then placed on the implanted wafer, and the wafer is annealed. The oxide cap is removed after annealing. The result of the process is the Silicon-on-Insulator substrate 12 including the bulk silicon layer 14, 5000 Angstrom oxide ($SiO_2$) insulator layer 16, and 1000-5000 Angstrom silicon layer 18.

The present invention is not limited to the SIMOX process. Other SOI or structures having other semiconductor materials formed on other insulator materials may be used for the substrate 12. These may be produced by the SPEAR process, Silicon-on Sapphire (SOS), etc., in which case the bulk silicon layer 14 would not be present, and the back gate electrode 32 would be formed directly on the insulator layer 16. If the bulk silicon layer 14 is present, it is preferably made as thin as possible. In an SOS material, the layers 14 and 16 are insulating, and there would be no back gate.

As viewed in FIG. 5b, the silicon dioxide insulator layer 28 is initially formed to a thickness of 120 Angstroms over the entire surface of the silicon layer 18. The front gate electrode 30 is formed by masking off the surrounding area with photoresist and depositing polysilicon using chemical vapor deposition (CVD). For optical transparency over a wide wavelength range, the gate electrode 30 is made thin, on the order of 1000 Angstroms.

FIG. 5c illustrates the result of etching the structure of FIG. 5b. Photoresist, which is applied to the front gate electrode 30 and subsequently removed, acts as a mask to prevent the etchant from acting on the front gate electrode 30 and the portion of the insulator layer 28 underlying the gate electrode 30. The polysilicon layer external of the gate electrode 30 is etched away to expose the underlying silicon layer 18.

As viewed in FIG. 5d, the N type emitter region 22 and collector region 24 are formed by diffusion, implantation, or other appropriate process. The gate electrode 30 acts as a mask which shields the base region 26 from the N type impurity ions. In this manner, the gate electrode 30 is self-aligned to the base region 26, being exactly coextensive therewith. The width and length of the base region 26 and gate electrode 30 are typically 1 micrometer. However, the frequency response of the device 10 may be further increased by reducing the base width to approximately 0.5 micrometer.

The final structure, illustrated in FIG. 1, includes the step of forming the back gate electrode 32 by, for example, evaporation or sputtering of aluminum. The back gate electrode 32 is at least coextensive with the regions 22, 24 and 26 of the bipolar phototransistor 20. The contact pads 34, 36, 38 and 40 are then made, using silicide for low series resistance.

The phototransistor device of the invention can be fabricated using conventional, 8-mask CMOS mesa-etched process technology, achieving low manufacturing cost and a packing density 30% to 50% greater than is possible with conventional bipolar phototransistors.

Experimental results indicate that a common emitter current gain $\beta$ on the order of 1000 is achievable using a fully depleted base region, and that a frequency response of 1 GHz is possible. Calculations indicate that operation of the device 10 as a microwave transistor would result in a cutoff frequency of approximately 25 GHz.

While an illustrative embodiment of the invention has been shown and described, numerous variations and alternate embodiments will occur to those skilled in the art, without departing from the spirit and scope of the invention. For example, only the front gate electrode 30 or the back gate electrode 32, rather than both electrodes 30 and 32, may be provided to accumulate the base region 26. Although the present device has been described and illustrated as including an NPN type lateral bipolar phototransistor, the invention may implemented in a PNP configuration. Complementary PNP and NPN devices may be fabricated on the same chip. Relative polarities, voltages, dimensions, process steps, materials, etc. may be varied in any appropriate manner from the specific disclosed embodiment to achieve the purpose of the invention. The silicon layers may be replaced by other semiconductors such as germanium or gallium arsenide. The silicon dioxide layers may be replaced by other insulator materials. Accordingly, it is intended that within the scope of the appended claims, the present invention may be practiced otherwise than as specifically described.

I claim:

1. A phototransistor device comprising:
   a semiconductor layer formed on an insulator substrate;
   a lateral bipolar phototransistor formed in the semiconductor layer and having an emitter region, a collector region, and a photosensitive floating base region disposed between the emitter and collector regions, the collector and base regions defining a junction therebetween, at least said junction being exposed to receive light which the phototransistor device is intended to detect;
   a transparent front gate electrode formed over the base region;
   a transparent insulating layer formed between the front gate electrode and the base region; and
   a back gate electrode formed on a surface of the substrate opposite to the semiconductor layer;
   the emitter region, collector region, base region and front gate electrode constituting a source, drain, channel and gate of a first field effect transistor respectively;
   the emitter region, collector region, base region and back gate electrode constituting a source, drain, channel and gate of a second field effect transistor respectively;
   the front and back gate electrodes causing, in response to respective applied bias voltages which are sufficiently high to bias the first and second field effect transistors into cutoff, accumulation of majority carriers in the base region in the form of two charge accumulation regions extending between the emitter and collector regions and facing the front and back gate electrodes respectively.

2. A phototransistor device as in claim 1, in which the transparent insulating layer and front gate electrode extend coextensively with the base region.

3. A phototransistor device as in claim 1, in which the front gate electrode extends coextensively with the base region.

4. A phototransistor device as in claim 1, in which the back gate electrode extends at least coextensively with the base region.

5. A phototransistor device as in claim 4, in which the back gate electrode extends coextensively with the emitter, base and collector regions.

* * * * *